(12) United States Patent
Nishihara et al.

(10) Patent No.: US 9,078,376 B2
(45) Date of Patent: Jul. 7, 2015

(54) POWER CONVERSION DEVICE

(75) Inventors: Atsuo Nishihara, Kashiwa (JP);
Kenichiro Nakajima, Hitachinaka (JP);
Keisuke Horiuchi, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 173 days.

(21) Appl. No.: 13/811,497

(22) PCT Filed: Jul. 25, 2011

(86) PCT No.: PCT/JP2011/066853
§ 371 (c)(1),
(2), (4) Date: Jan. 22, 2013

(87) PCT Pub. No.: WO2012/014842
PCT Pub. Date: Feb. 2, 2012

(65) Prior Publication Data
US 2013/0128646 A1 May 23, 2013

(30) Foreign Application Priority Data
Jul. 28, 2010 (JP) ................................ 2010-168813

(51) Int. Cl.
*H05K 7/20* (2006.01)
*H01L 23/367* (2006.01)
(Continued)

(52) U.S. Cl.
CPC ................ *H05K 7/20* (2013.01); *H01L 23/367* (2013.01); *H01L 23/552* (2013.01); *H01L 25/072* (2013.01);
(Continued)

(58) Field of Classification Search
CPC ..................... H01L 23/473; H01L 2924/0002; H05K 7/20927; H02M 7/003

USPC ........ 363/17, 49, 65, 141–146; 361/386, 403, 361/407, 689, 699, 718, 719; 257/23.101, 257/704, 710, 715, 717, 719; 165/80.4, 165/104.26, 122, 185
See application file for complete search history.

(56) References Cited

U.S. PATENT DOCUMENTS 5,978,220 A * 11/1999 Frey et al. ...................... 361/699
7,435,623 B2 * 10/2008 Chrysler et al. ............... 438/122
(Continued)

FOREIGN PATENT DOCUMENTS

JP         2-210899 A     8/1990
JP    2005-348533 A    12/2005
(Continued)

OTHER PUBLICATIONS

International Search Report with English translation dated Oct. 11, 2011 (two (2) sheets).

*Primary Examiner* — Rajnikant Patel
(74) *Attorney, Agent, or Firm* — Crowell & Moring LLP

(57) ABSTRACT

A power conversion device includes: a cooling base 5 in which a flow passage 51 through which a cooling medium flows is formed and an opening portion 50 which is communicated with the flow passage 51 is formed; a power module 1; and a flow passage control portion 16b. The power module 1 has a bottomed cylindrical portion 13a in which a power semiconductor element is housed and which is inserted into the flow passage 51 through the opening portion 50, a flange portion 13b which is formed on an opening of the cylindrical portion 13a and is fixed to the cooling base 5 so as to close the opening portion 50, and a group of radiator fins 144 which are mounted on an outer peripheral surface of the cylindrical portion 13a with a gap of a predetermined distance formed between the flange portion 13b and the group of radiator fins 144. The flow passage control portion 16b is arranged in a gap formed between the flange portion 13b and the group of radiator fins 144, and introduces the cooling medium into the group of radiator fins 144 while preventing the cooling medium from flowing into gaps 51c.

6 Claims, 19 Drawing Sheets

(51) Int. Cl.
*H02M 7/00* (2006.01)
*H01L 23/473* (2006.01)
*H01L 23/552* (2006.01)
*H01L 25/07* (2006.01)
*H02M 7/48* (2007.01)

(52) U.S. Cl.
CPC ............... *H01L 2924/1203* (2013.01); *H01L 2924/13055* (2013.01); *H01L 2924/13091* (2013.01); *H02M 7/003* (2013.01); *H01L 23/473* (2013.01); *H02M 7/48* (2013.01); *H01L 2924/0002* (2013.01)

(56) References Cited

U.S. PATENT DOCUMENTS

| | | | |
|---|---|---|---|
| 7,859,103 B2 * | 12/2010 | Aoki et al. | 257/714 |
| 8,064,198 B2 * | 11/2011 | Higashidani et al. | 361/679.53 |
| 8,363,402 B2 * | 1/2013 | Brunschwiler et al. | 361/699 |
| 8,659,898 B2 * | 2/2014 | Brunschwiler et al. | 361/699 |
| 2011/0299265 A1 | 12/2011 | Nakatsu et al. | |

FOREIGN PATENT DOCUMENTS

| | | | |
|---|---|---|---|
| JP | 4168825 B2 | 10/2008 | |
| JP | 2010-110143 A | 5/2010 | |

* cited by examiner

POWER CONVERSION DEVICE

TECHNICAL FIELD

The present invention relates to a power conversion device.

BACKGROUND ART

An electric automobile or a hybrid automobile mounts a motor as a power source for a vehicle thereon, and includes a power conversion device such as an inverter for controlling electric power to be supplied to the motor. The power conversion device includes a power module which incorporates a power semiconductor element such as an IGBT therein, a drive circuit which drives the power module, a control circuit for controlling these parts, and a current smoothing capacitor. Since these electronic parts are weak with respect to heat, it is necessary to cool these parts. In many cases, a large-capacity power conversion device with a large heat value is provided with a cooler having the water cooler structure for circulating cooling water therein.

Among the electronic parts which constitute the power conversion device, the power module is the part which has the largest heat value. To enhance cooling performance of the power module, the double-sided cooling structure which simultaneously cools both surfaces of the semiconductor element is effective. As an example of the double-sided cooling mounting structure of the power module, there has been known the structure described in patent literature 1.

CITATION LIST

Patent Literature
PTL 1: Japanese patent 4168825 specification

SUMMARY OF INVENTION

Technical Problem

However, in the structure where a power module is inserted into a water passage, cooling water flows around cooling fins and hence, there exists a drawback that cooling performance of the power module is lowered.

Solution to Problem

According to a first aspect of the present invention, there is provided a power conversion device which includes: a flow passage casing in which a flow passage through which a cooling medium flows is formed and an opening portion which is communicated with the flow passage is formed; a power module having a bottomed cylindrical portion in which a power semiconductor element is housed and which is inserted into the flow passage through the opening portion, a flange portion which is formed on an opening of the cylindrical portion and is fixed to the flow passage casing so as to close the opening portion, and a group of radiator fins which are mounted on an outer peripheral surface of the cylindrical portion with a gap of a predetermined distance formed between the flange portion and the group of radiator fins; and a flow passage control member which is arranged in a gap formed between the flange portion and the group of radiator fins, and introduces the cooling medium into the group of radiator fins, wherein power is converted into AC power from DC power or into DC power from AC power by a switching operation of the power semiconductor element.

According to a second aspect of the present invention, in the power conversion device of the first aspect, it is preferable that the flow passage control member be arranged such that a minimum distance between the flow passage control member and the group of radiator fins is set equal to or less than a distance between the fins of the group of radiator fins.

According to a third aspect of the present invention, in the power conversion device of the first or the second aspect, it is preferable that the flow passage control member be continuously distributed in the gap along the flow direction of the cooling medium.

According to a fourth aspect of the present invention, in the power conversion device of the third aspect, it is preferable that the flow passage control member have a shape by which the distance between the flow passage control member and the group of radiator fins is decreased along the flow direction of the cooling medium.

According to a fifth aspect of the present invention, in the power conversion device of the third aspect, it is preferable that the flow passage control member have a shape by which the distance between the flow passage control member and the group of radiator fins becomes minimum at the center in the flow direction of the group of radiator fins, and the distance is gradually increased in terms of being further away from the center in the flow direction.

According to a sixth aspect of the present invention, in the power conversion device of any one of the first to fifth aspects, it is preferable that the flow passage control member be integrally formed with a seal member which is arranged between the flow passage casing and the flange portion.

Advantageous Effects of Invention

According to the present invention, cooling performance of the power module can be enhanced.

Figure 1:
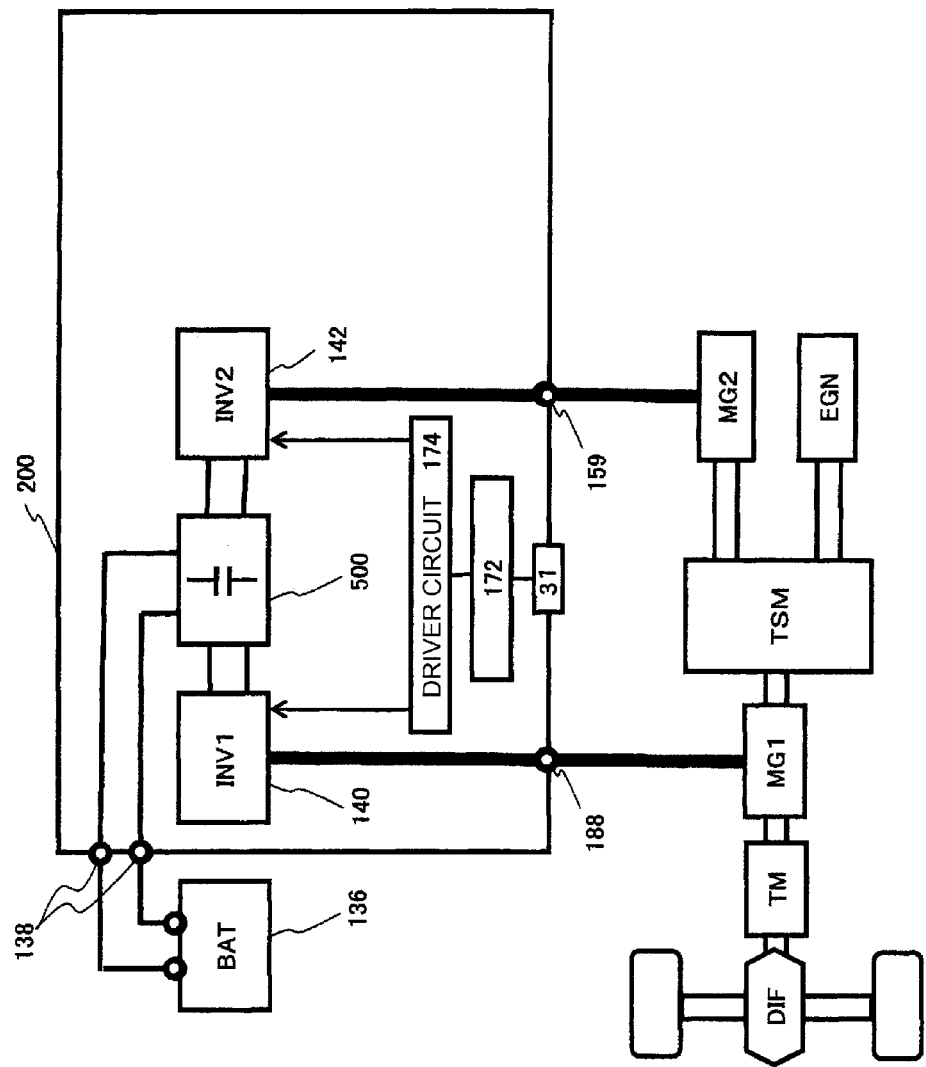
FIG. 1
A control block diagram of a hybrid automobile.

A view for explaining the manner of operation of a flow passage control portion 16b.

FIG. 13

A view showing a comparison example.

FIG. 14

A view showing a seal member 20 on which a flow passage control portion 20b is formed.

FIG. 15

A view for explaining the manner of operation of the flow passage control portion 20b.

FIG. 16

A view showing a seal member 21 on which a flow passage control portion 21b is formed.

FIG. 17

A view showing a seal member 22 and a flow passage control member 23 which are formed as separate bodies.

FIG. 18

A view showing the constitution which uses a pusher plate 24.

FIG. 19

A view showing the constitution which uses a pusher plate 25.

DESCRIPTION OF EMBODIMENTS

Hereinafter, an embodiment of the present invention is explained in conjunction with drawings. FIG. 1 is a control block diagram of a hybrid automobile (hereinafter, described as "HEV"). An engine EGN, a motor generator MG1 and a motor generator MG2 generate torques for traveling of a vehicle respectively. The motor generator MG1 and the motor generator MG2 have not only a function of generating a rotational torque but also a function of converting kinetic energy which is applied to the motor generator MG1 or the motor generator MG2 from the outside into electric power.

The motor generators MG1, MG2 are synchronous motors or induction motors, for example, and as described above, are operated as either motors or generators depending on an operation method. When the motor generators MG1, MG2 are mounted on an automobile, it is desirable that the motor generators MG1, MG2 are small-sized motors and can acquire a high output. Accordingly, a permanent-magnet-type synchronous motor in which a magnet such as a neodymium magnet is used is suitable for the motor generators MG1, MG2. Further, heat generated by a rotor of the permanent-magnet-type synchronous motor is smaller than heat generated by a rotor of an induction motor and hence, the permanent-magnet-type synchronous motor is superior to the induction motor as a motor for an automobile also from such a viewpoint.

An output torque of an output side of the engine EGN and an output torque of the motor generator MG2 are transmitted to the motor generator MG1 by way of a power distribution mechanism TSM. A rotational torque from the power distribution mechanism TSM or a rotational torque generated by the motor generator MG1 is transmitted to wheels by way of a transmission TM and a differential gear DIF. On the other hand, at the time of operating regenerative braking, a rotational torque is transmitted to the motor generator MG1 from the wheels, and AC power is generated based on the supplied rotational torque.

The generated AC power is converted into DC power by a power conversion device 200 as described later, a high-voltage battery 136 is charged with DC power, and charged electric power is used as energy for traveling of a vehicle again. When electric power which is stored in the high-voltage battery 136 becomes small, rotational energy generated by the engine EGN is converted into AC power using the motor generator MG2. By converting this AC power into DC power using the power conversion device 200, the battery 136 can be charged with DC power. The transmission of kinetic energy from the engine EGN to the motor generator MG2 is performed by the power distribution mechanism TSM.

Next, the power conversion device 200 is explained. Inverter circuits 140, 142 are electrically connected with the battery 136 via DC connectors 138 so that the supply/reception of electric power is performed between the battery 136 and the inverter circuits 140, 142. When the motor generator MG1 is to be operated as a motor, the inverter circuit 140 generates AC power based on DC power supplied from the battery 136 via the DC connector 138, and supplies the AC power to the motor generator MG1 via an AC terminal 188. The constitution formed of the motor generator MG1 and the inverter circuit 140 is operated as a first electrically-operated power generation unit.

When the motor generator MG2 is to be operated as a motor in the same manner as the motor generator MG1, the inverter circuit 142 generates AC power based on DC power which is supplied from the battery 136 via the DC connector 138, and supplies the AC power to the motor generator MG2 via an AC terminal 159. The constitution formed of the motor generator MG2 and the inverter circuit 142 is operated as a second electrically-operated power generation unit.

As the manner of operating the first electrically-operated power generation unit and the second electrically-operated power generation unit, depending on a driving state, there are a case where both the first and second electrically-operated power generation units are operated as a motor or a power generator, and a case where the first and second electrically-operated power generation units are used differently such that one is used as a motor and the other is used as a power generator. Further, there may be a case where one of the first and second electrically-operated power generation units is not operated and is brought into a stop state. In this embodiment, by operating the first electrically-operated power generation unit as an electrically-operated unit using electric power of the battery 136, the vehicle can be driven using only power of the motor generator MG1. Further, in this embodiment, the charging of the battery 136 is performed in such a manner the first electrically-operated power generation unit or the second electrically-operated power generation unit is operated as a power generation unit using power of the engine 120 or power from the wheels thus generating electric power.

Although not shown in FIG. 1, the battery 136 is used also as a power source for driving a motor for an auxiliary device. As the motor for an auxiliary device, for example, a motor which drives a compressor of an air conditioner or a motor which drives a hydraulic pump for control is named. DC power is supplied to a power module for an auxiliary device from the battery 136, and the power module for an auxiliary device generates AC power and supplies the AC power to the motor for an auxiliary device. The power module for an auxiliary device basically has the substantially same circuit constitution and functions as the inverter circuit 140, and controls a phase, a frequency and electric power of an alternating current to be supplied to the motor for an auxiliary device. The power conversion device 200 includes a capacitor module 500 for smoothing DC power supplied to the inverter circuit 140.

The power conversion device 200 includes a connector 31 for communication for receiving a command from a host control device or for transmitting data indicative of a state of the power conversion device 200 to the host control device. A control circuit 172 of the power conversion device 200 calculates controlled variables of the motor generator MG1, the motor generator MG2 and a motor 195 for an auxiliary device based on commands which the control circuit 172 receives via the connector 31. Further, the control circuit 172 calculates whether the motor generator MG1 or the motor generator MG2 is to be operated as a motor or a generator, generates a control pulse based on a calculation result, and supplies the control pulse to a driver circuit 174 and a driver circuit 350B of a module 350 for an auxiliary device. The driver circuit 174 generates a drive pulse for controlling the inverter circuit 140 and the inverter circuit 142 based on the supplied control pulse.

Figure 2:
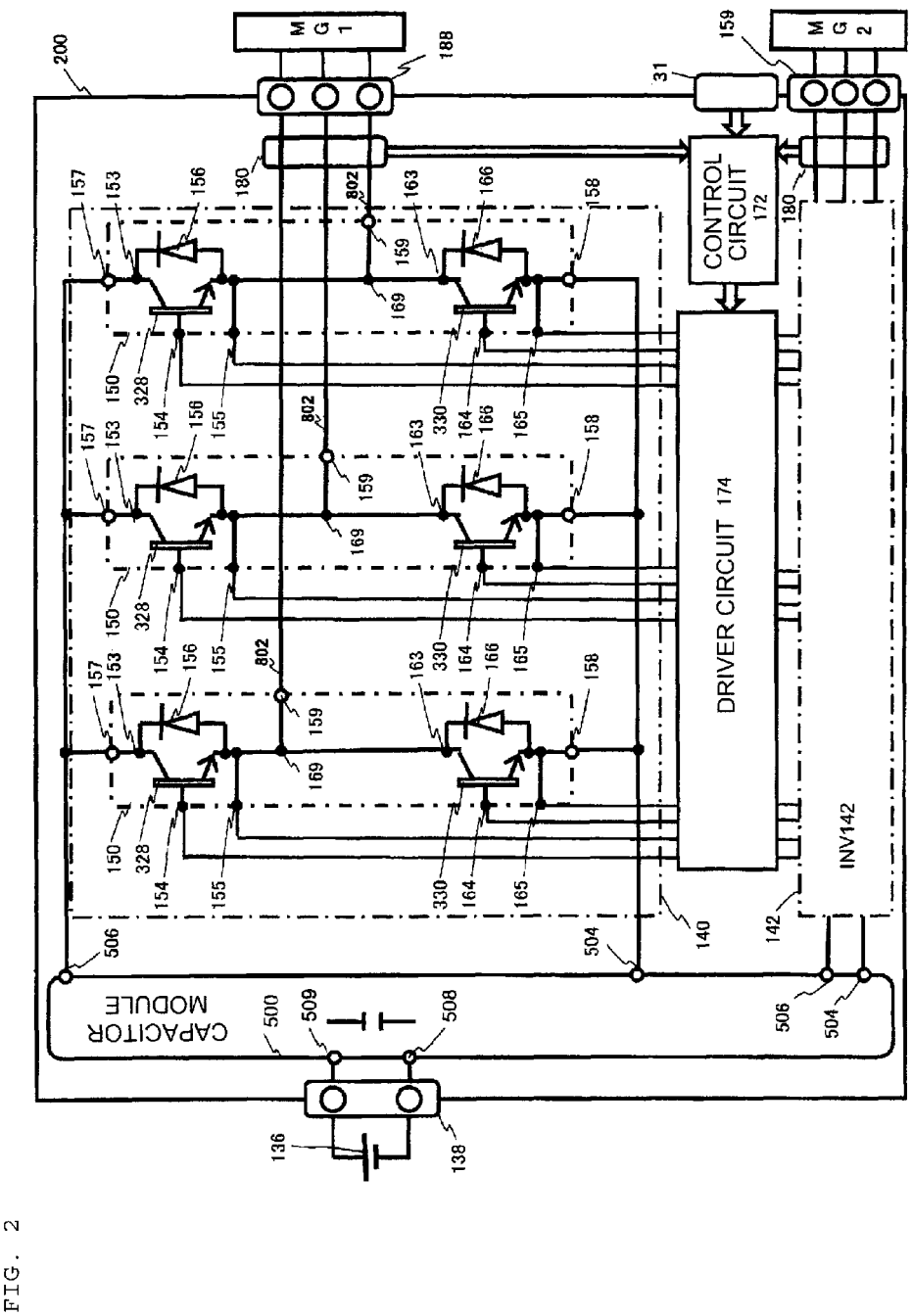
FIG. 2
A view for explaining the constitution of an electric circuit of an inverter circuit 140.

Next, the constitutions of electric circuits of the inverter circuit 140 and the inverter circuit 142 are explained in conjunction with FIG. 2. The inverter circuit 140 and the inverter circuit 142 are extremely similar to each other with respect to the circuit constitution and the manner of operation and hence, the explanation is made hereinafter by taking the inverter circuit 140 as a representing example. Further, in the explanation made hereinafter, an insulated-gate bipolar transistor is used as a semiconductor element, and the insulated-gate bipolar transistor is abbreviated as IGBT hereinafter.

A series circuit of upper and lower arms 150 is constituted of an IGBT 328 and a diode 156 which are operated as an upper arm and an IGBT 330 and a diode 166 which are operated as a lower arm. The inverter circuit 140 includes these series circuits of upper and lower arms 150 corresponding to three phases, that is, a U phase, a V phase and a W phase of AC power to be outputted.

In this embodiment, these three phases respectively correspond to respective windings of three phases of armature winding of the motor generator MG1. In the series circuit of upper and lower arms 150 for each of three phases, an AC current is outputted from an intermediate electrode 169 which is a middle portion of the series circuit. The intermediate electrode 169 is connected to AC bus bars 802, 804 via the AC terminal 159 and the AC terminal 188, wherein the AC terminal 159 and the AC terminal 188 are AC power lines leading to the motor generator MG1, and are explained hereinafter.

A collector electrode 153 of the IGBT 328 of the upper arm is electrically connected to a positive-pole-side capacitor terminal 506 of the capacitor module 500 via a positive pole terminal 157. An emitter electrode of the IGBT 330 of the lower arm is electrically connected to a negative-pole-side capacitor terminal 504 of the capacitor module 500 via a negative pole terminal 158.

As described above, the control circuit 172 receives control commands from the host control device via the connector 31; generates control pulses which are control signals for controlling the IGBTs 328 and the IGBTs 330 which constitute the upper arms or the lower arms of the series circuits of upper and lower arms 150 of respective phases which form the inverter circuit 140 based on the control commands; and supplies the control pulses to the driver circuit 174.

The driver circuit 174 supplies drive pulses for controlling the IGBTs 328 or the IGBTs 330 which constitute the upper arms or the lower arms of the series circuit of upper and lower arms 150 of respective phases based on the above-mentioned control pulse. The IGBTs 328 and the IGBTs 330 perform a conduction operation or an interruption operation based on the drive pulses from the driver circuit 174 thus converting DC power supplied from the battery 136 into three-phase AC power. The converted power is supplied to the motor generator MG1.

The IGBT 328 includes the collector electrode 153, an emitter electrode 155 for signal, and a gate electrode 154. The IGBT 330 includes a collector electrode 163, an emitter electrode 165 for signal, and a gate electrode 164. The diode 156 is electrically connected between the collector electrode 153 and the emitter electrode 155. The diode 166 is electrically connected between the collector electrode 163 and the emitter electrode 165.

A metal oxide semiconductor field effect transistor (abbreviated as MOSFET hereinafter) may be used as a switching power semiconductor element. In this case, the diode 156 and the diode 166 become unnecessary. As the switching power semiconductor element, an IGBT is suitable for a case where a DC voltage is relatively high, and a MOSFET is suitable for a case where a DC voltage is relatively low.

The capacitor module 500 includes: the plurality of positive-pole-side capacitor terminals 506; the plurality of negative-pole-side capacitor terminals 504; a positive-pole-side power source terminal 509 and a negative-pole-side power source terminal 508. DC power of high voltage from the battery 136 is supplied to the positive-pole-side power source terminal 509 and the negative-pole-side power source terminal 508 via the DC connector 138, and is supplied to the inverter circuit 140 from the positive-pole-side capacitor terminal 506 and the negative-pole-side capacitor terminal 504 of the capacitor module 500.

On the other hand, DC power which is obtained by the conversion of AC power into DC power by the inverter circuit 140 or the inverter circuit 142 is supplied to the capacitor module 500 from the positive-pole-side capacitor terminal 506 and the negative-pole-side capacitor terminal 504, is supplied to the battery 136 from the positive-pole-side power source terminal 509 and the negative-pole-side power source terminal 508 via the DC connector 138, and is stored in the battery 136.

The control circuit 172 includes a microcomputer (hereinafter referred to as "micon") for arithmetically processing switching timings of the IGBT 328 and the IGBT 330. As input information to be inputted to the micon, a target torque value which the motor generator MG1 is required to generate, a current value of an electric current supplied to the motor generator MG1 from the series circuit of upper and lower arms 150, and a magnetic pole position of a rotor of the motor generator MG1 are named.

A target torque value is based on a command signal outputted from a host control device not shown in the drawing. A current value is detected based on a detection signal transmitted from a current sensor 180. A magnetic pole position is detected based on a detection signal outputted from a rotation magnetic pole sensor (not shown in the drawing) such as a resolver mounted on the motor generator MG1. In this embodiment, although a case where the current sensor 180 detects current values of three phases is exemplified, current values amounting to two phases may be detected, and electric currents amounting to three phases may be obtained by calculation.

The micon in the control circuit 172 calculates current command values on a d axis and a q axis of the motor generator MG1 based on a target torque value, calculates voltage command values on the d axis and the q axis based on the difference between the calculated current command values on the d axis and the q axis and the detected current values on the d axis and the q axis, and converts the calculated voltage command values on the d axis and the q axis into voltage command values of a U phase, a V phase and a W phase based on detected magnetic pole positions. Then, the micon generates a pulse-shaped modulated wave based on a comparison between a fundamental wave (sinusoidal wave) based on the voltage command values of the U phase, the V phase and the W phase and a carrier wave (triangular wave), and outputs the generated modulated wave to the driver circuit 174 as a PWM (pulse width modulation) signal.

The driver circuit 174, in driving the lower arm, outputs a drive signal obtained by amplifying the PWM signal to a gate electrode of the IGBT 330 of the corresponding lower arm. The driver circuit 174, in driving the upper arm, amplifies a PWM signal after shifting a level of a reference potential of the PWM signal to a level of a reference potential of the upper arm, and outputs the amplified PWM signal to a gate electrode of the IGBT 328 of the corresponding upper arm as a drive signal.

The micon in the control circuit 172 performs the detection of abnormality (an overcurrent, an overvoltage, an overtemperature or the like) thus protecting the series circuit of upper and lower arms 150. Accordingly, sensing information is inputted to the control circuit 172. For example, information on electric currents which are supplied to an emitter electrode of the IGBT 328 and an emitter electrode of the IGBT 330 is respectively inputted to a corresponding drive part (IC) from the emitter electrode 155 for signal and the emitter electrode 165 for signal of the respective arms. Due to such a constitution, each drive part (IC) performs the overcurrent detection, and stops a switching operation of the corresponding IGBT 328 or IGBT 330 when an overcurrent is detected thus protecting the corresponding IGBT 328 or IGBT 330 from an overcurrent.

Information on the temperature of the series circuit of upper and lower arms 150 is inputted to the micon from a temperature sensor (not shown in the drawing) mounted in the series circuit of upper and lower arms 150. Further, information on a voltage on a DC positive pole side of the series circuit of upper and lower arms 150 is inputted in the micon. The micon performs the overtemperature detection and the overvoltage detection based on these information, and stops the switching operations of all IGBTs 328 and IGBTs 330 when an overtemperature or an overvoltage is detected.

Figure 3:
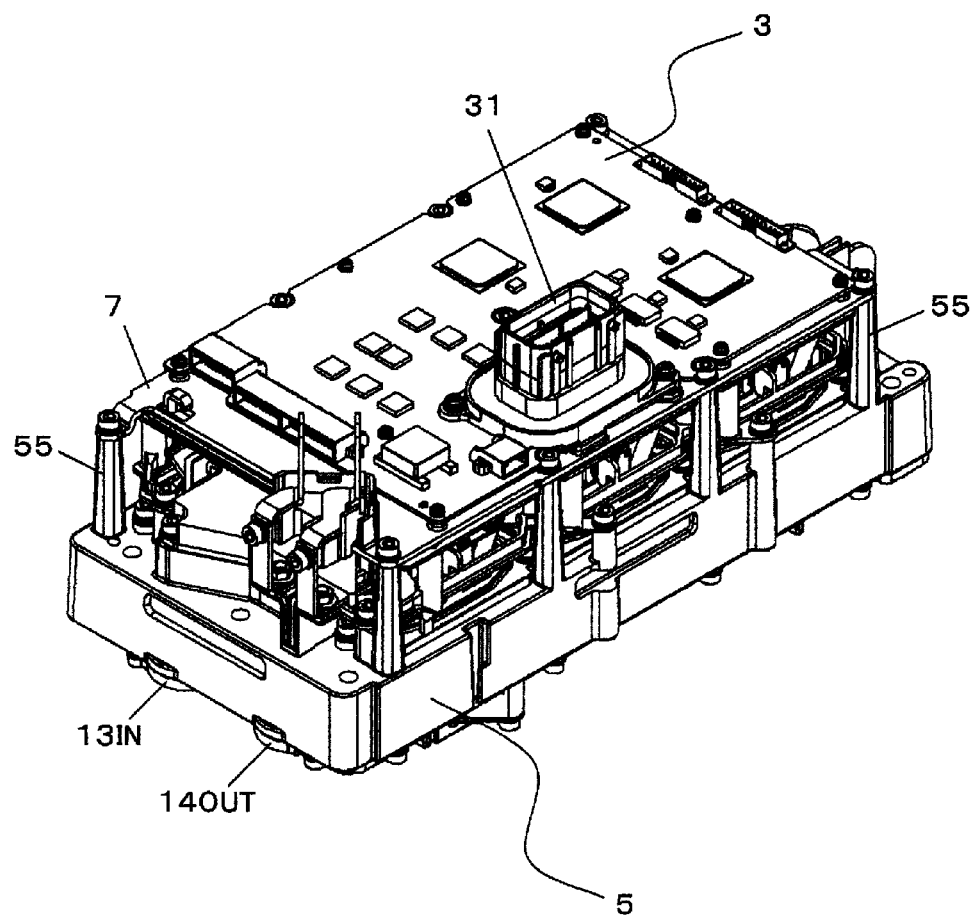
FIG. 3
A perspective view of a power conversion device 200.
Figure 4:
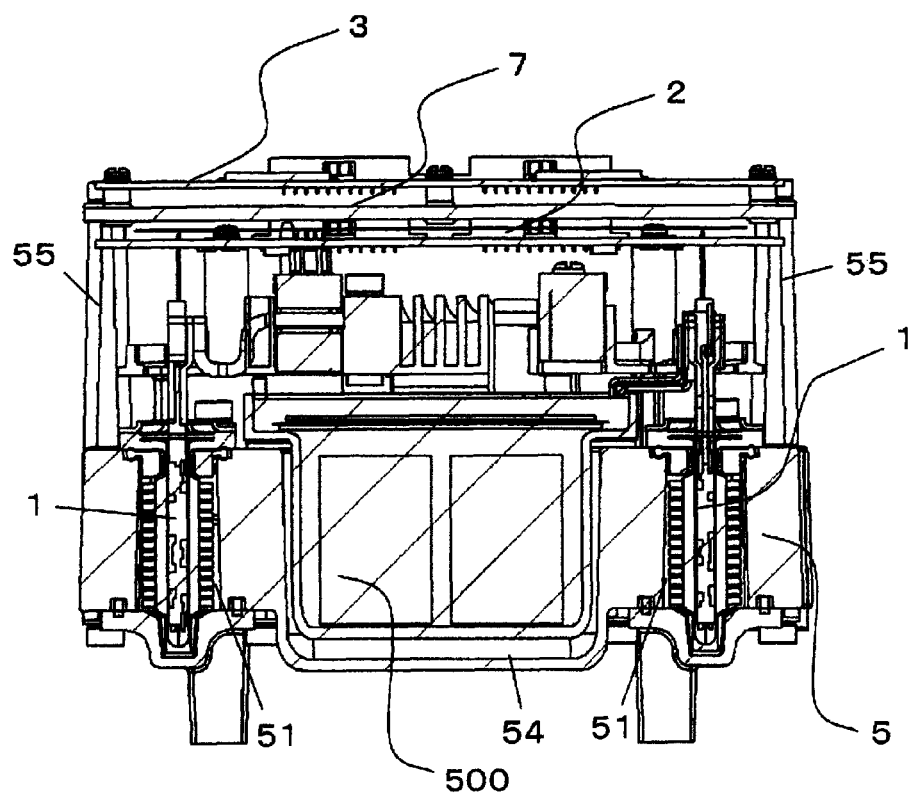
FIG. 4
An exploded perspective view of the power conversion device 200.
Figure 5:
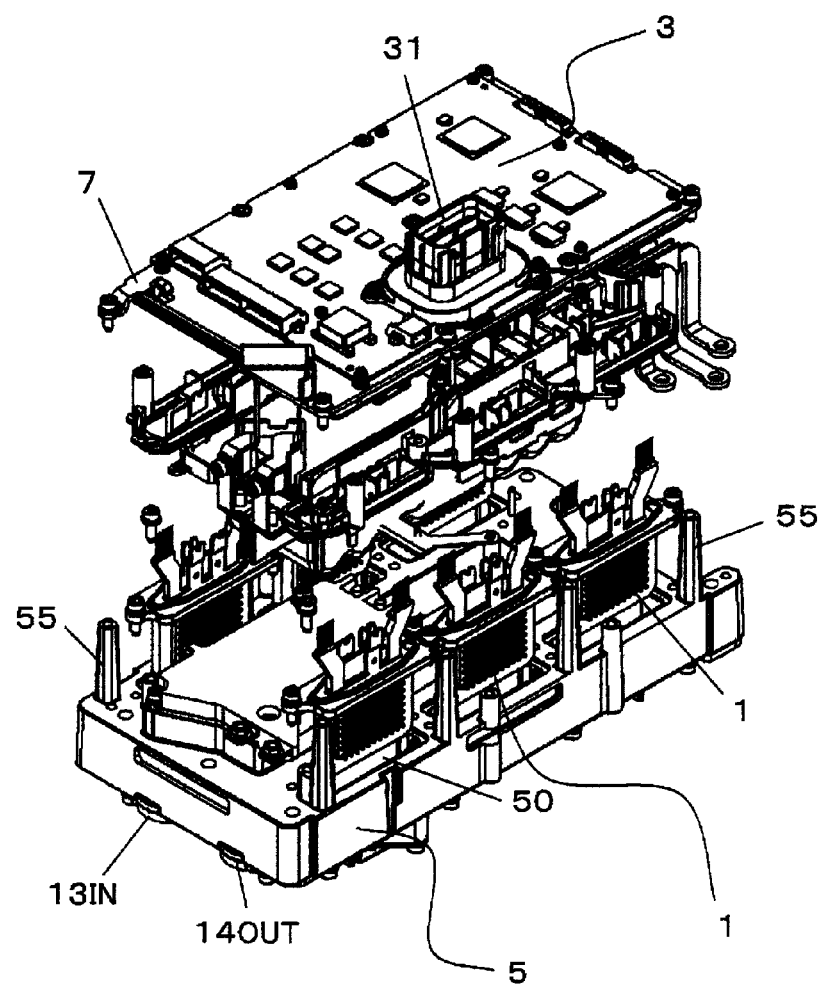
FIG. 5
A cross-sectional view taken along a line A-A in FIG. 3.

FIG. 3 to FIG. 5 are views showing the schematic constitution of the power conversion device 200 according to this embodiment, wherein FIG. 3 is a perspective view of the power conversion device 200, FIG. 4 is an exploded perspective view of the power conversion device 200, and FIG. 5 is a cross-sectional view taken along a line A-A in FIG. 3. In the power conversion device 200 of this embodiment, a shape of the power conversion device 200 as viewed in a plan view is formed into an approximately rectangular shape so that the power conversion device 200 can acquire advantageous effects that the power conversion device 200 can be easily mounted on a vehicle, and can be easily manufactured. The power conversion device 200 includes a housing and a lid made of aluminum which are fixed to the transmission TM, and circuit parts of the power conversion device 200 are housed in the inside of the housing. However, in FIG. 3 to FIG. 5, the illustration of the housing and the lid is omitted.

The power conversion device 200 includes: a cooling base 5 in which the capacitor module 500 and a power modules 1 are housed; and a drive circuit board 2, a control circuit board 3 and the like which are arranged over the cooling base 5. The above-mentioned control circuit 172 is mounted on the control circuit board 3. In the cooling base 5, a flow passage 51 through which a cooling medium flows, and a capacitor housing portion 54 which is formed such that the capacitor housing portion 54 is surrounded by the flow passage 51 are formed. The capacitor module 500 is housed in the capacitor housing portion 54, and is cooled through a wall surface of the flow passage 51.

A plurality of opening portions 50 are formed in the cooling base 5 along the flow passage 51. The power module 1 is constituted such that the above-mentioned series circuit of upper and lower arms 150 is housed in the inside of a metal casing, and generates the largest heat value among the electronic parts. Accordingly, the plurality of power modules 1 are inserted into the inside of the flow passage 51 through the opening portions 50 and are directly cooled by a cooling medium. An inlet port 13IN and a discharge port 14OUT are formed in a bottom portion of the cooling base 5. A cooling medium (for example, cooling water) flows into the inside of the flow passage 51 through the inlet port 13IN, circulates in the flow passage 51 and, thereafter, is flown out from the discharge port 14OUT.

The control circuit board 3 is arranged on an upper portion of a board base 7 made of aluminum which is fixed to support struts of the cooling base 5, and the drive circuit board 2 is arranged on a lower side of the board base 7. The drive circuit board 2 and the control circuit board 3 are thermally connected to the board base 7 made of aluminum so that heat generated in the drive circuit board 2 and the control circuit board 3 is leaked to a cooling medium in the flow passage 51 from the board base 7 through support struts 55. The board base 7 also functions as an electromagnetic shield for a group of circuits mounted on the drive circuit board 2 and the control circuit board 3.

The connector 31 is mounted on the control circuit board 3. The connector 31 is connected with an external control device, and the signal transmission is performed between the control circuit 172 mounted on the control circuit board 2 and the external control device such as a host control device. DC power of a low voltage for operating the control circuits in the inside of the power conversion device 200 is supplied from the connector 31. Although the direction of a fitting surface of a terminal such as the connector 31 differs variously depending on a type of a vehicle, particularly in a case of mounting the power conversion device 200 on a small-sized vehicle, it is preferable to arrange the terminal such that the fitting surface is exposed upwardly from a viewpoint of the restriction imposed due to a size of the inside of an engine room or assembling property. Particularly, when the power conversion device 200 is arranged above a transmission TM, the operability is enhanced by projecting the fitting surface of the terminal toward a side opposite to a side where the transmission TM is arranged.

Figure 6:
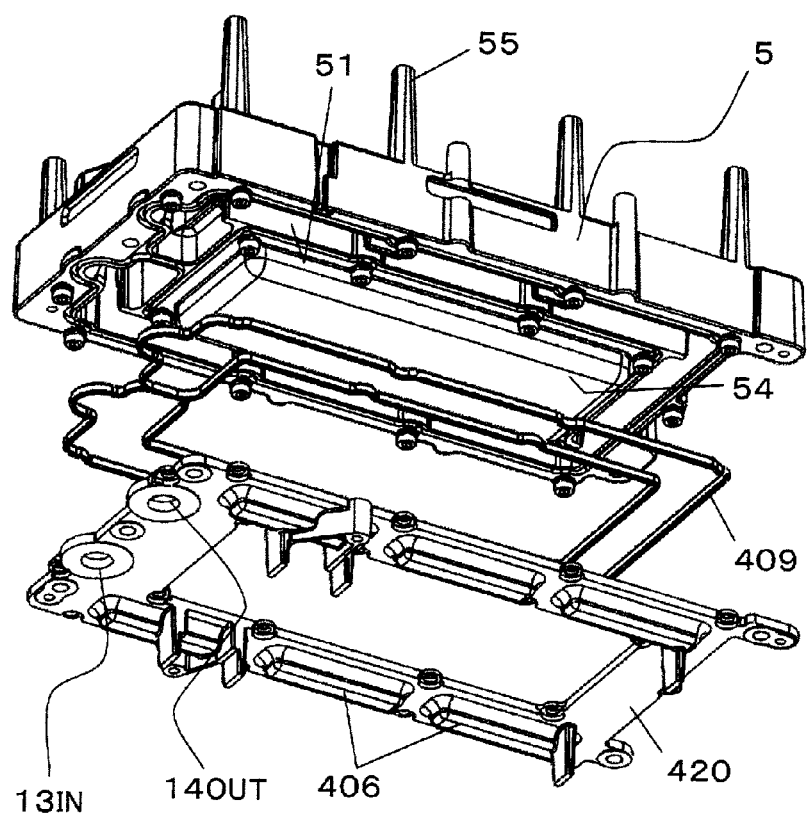
FIG. 6
An exploded perspective view of a cooling base 5.

FIG. 6 is an exploded perspective view of the cooling base 5, and is a view of the cooling base as viewed from a bottom surface side. The flow passage 51 is formed such that the flow passage 51 surrounds the capacitor housing portion 54. One end of the flow passage 51 is communicated with the inlet port 13IN formed in a lower cover 420, and the other end of the flow passage 51 is communicated with the discharge port 14OUT formed in the lower cover 420. By downwardly indenting the lower cover member, projecting portions 406 are formed on the lower cover 420 at positions where the openings 50 face the flow passage 51 respectively. Distal end portions of the power modules 1 which are inserted into the flow passage 51 are inserted into the inside of recessed portions formed in the projecting portions 406. Numeral 409 indicates a seal member for sealing a gap formed between the lower cover 420 and the cooling base 5.

Figure 7:
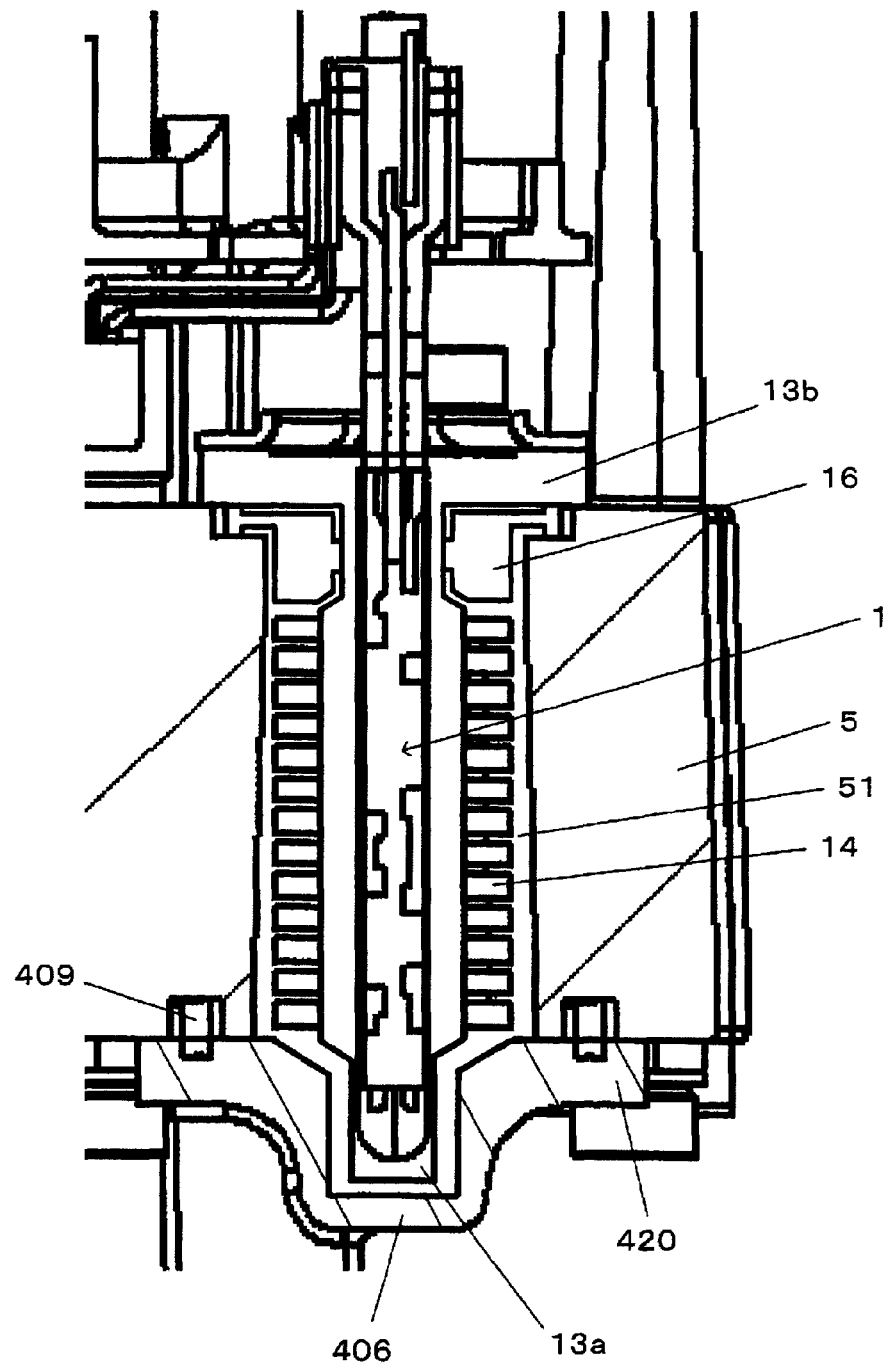
FIG. 7
An enlarged cross-sectional view showing a portion of the cooling base 5.

FIG. 7 is a view showing a part of the cross-sectional view shown in FIG. 4 in such a manner that a portion of the flow passage portion in which the power modules 1 are housed is shown in an enlarged manner. An opening of the flow passage 51 which is formed in the cooling base 5 on a base back surface side is hermetically closed by the lower cover 420. With respect to the power module 1, a cylindrical portion on which radiator fins 14 are formed is inserted into the flow passage 51 through the opening portion 50 (see FIG. 5) and a flange portion 13b is fixed to an upper surface of the cooling base 5. A distal end portion (lower end portion in the drawing) of a cylindrical portion 13a of the power module 1 is inserted into the recessed portion formed in the projecting portion 406 of the lower cover 420. A seal member 16 is provided to a sealing portion between the flange portion 13b and the cooling base 5, and the opening portion 50 is hermetically sealed by the flange portion 13b. A part of the seal member 16 is inserted into a gap formed between the flange portion 13b and the radiator fins 14.

Figure 8:
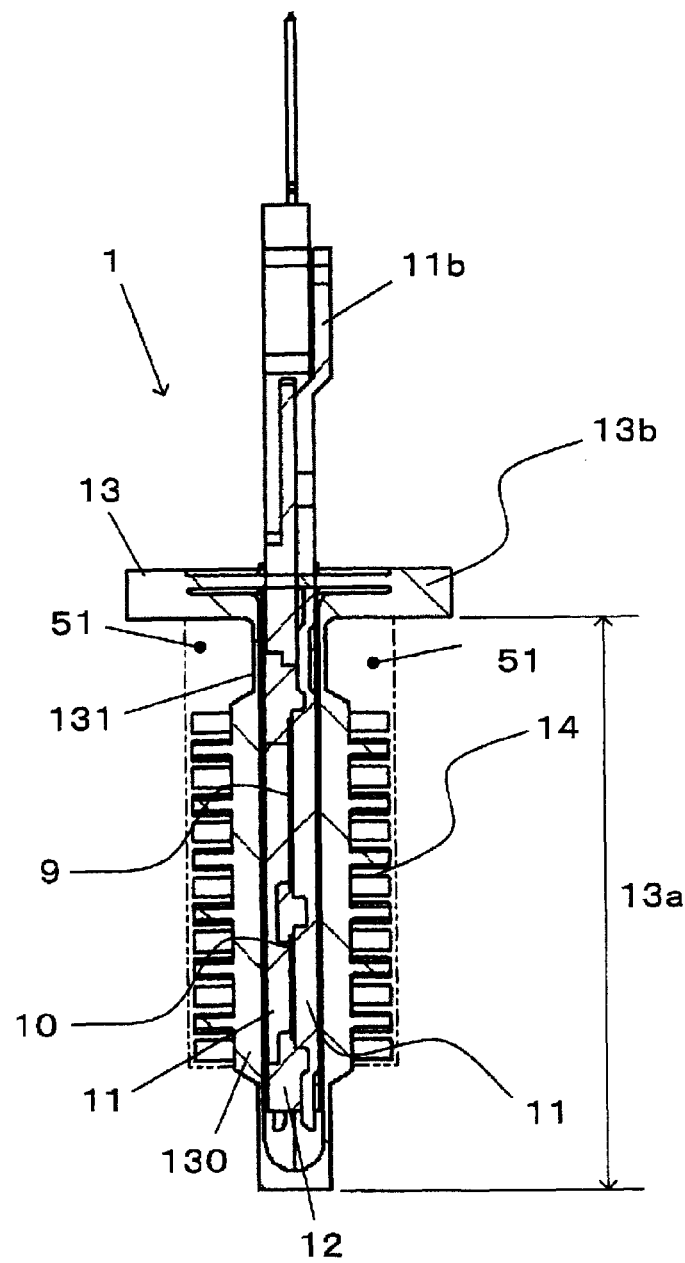
FIG. 8
A cross-sectional view of a power module 1.
Figure 9:
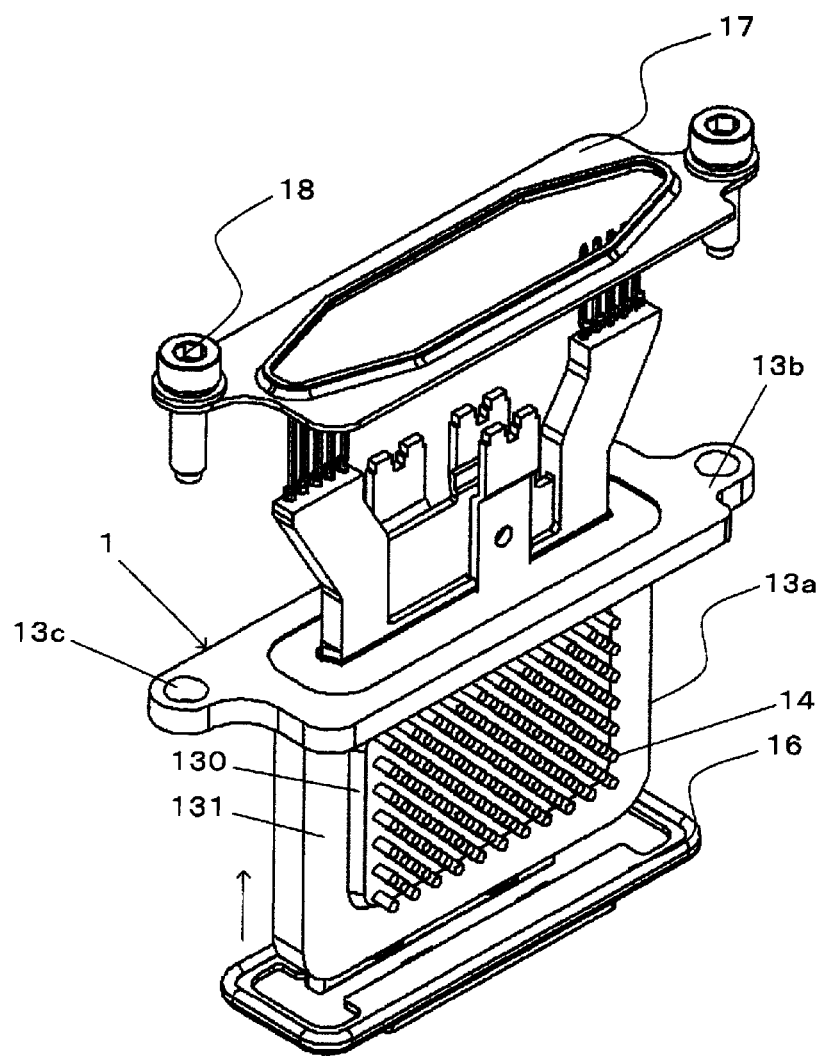
FIG. 9
A perspective view showing the external appearance of the power module 1.

FIG. 8 is a cross-sectional view of the power module 1, and FIG. 9 is a perspective view of the external appearance of the power module 1. The power module 1 is constituted such that the power semiconductor element (IGBT 9 and diode 10) which constitutes the above-mentioned series circuit of upper and lower arms 150 is incorporated in a can-shaped casing 13 made of aluminum. The IGBT 9 corresponds to IGBTs 154, 164 in FIG. 2 and the diode 10 corresponds to the diodes 156, 166 in FIG. 2. The casing 13 includes the cylindrical portion 13a in which a transfer mold body is housed, and the flange portion 13b for fixing the power module 1 to the cooling base 5. As shown in FIG. 9, bolt holes 13c are formed in the flange portion 13b. The IGBT 9 and the diode 10 which are incorporated in the cylindrical portion 13a have both front and back surfaces thereof sandwiched by copper leads 11 which constitute electrodes respectively, and these parts are formed into an integral body by transfer molding using a resin 12. Terminal portions 11b of the copper leads 11 project toward the outside of the casing 13 from the flange portion 13b.

The casing 13 plays a role of a radiator which radiates heat generated from the power semiconductor element. The casing 13 is constituted such that the plurality of radiator fins (pin fins) 14 are mounted in a raised manner on outer peripheral surfaces of thick wall portions 130 of the cylindrical portion 13a, that is, on radiation surfaces. The periphery of the thick wall portion 130 forms a thin wall portion 131. In manufacturing the power module 1, a transfer mold body is inserted into the inside of the casing 13 in a state where the transfer mold body is sandwiched by insulation sheets having an adhesive property. A back surface side of the copper leads 11 is exposed on both front and back surfaces of the transfer mold body, and the thick wall portions 130 are pressed toward the inside of the casing such that the exposed surfaces are brought into close contact with an inner peripheral surface of the casing 13 with the above-mentioned insulation sheet sandwiched therebetween. When such pressing is performed, the thin wall portions 131 are plastically deformed, and inner peripheral surfaces of the thick wall portions 130 are brought into close contact with and are fixed to both front and back surfaces of the transfer mold body.

The casing 13 is, for reducing a manufacturing cost, formed of an integral-body-type vessel which is formed in such a manner that the forming of the casing 13 into a can shape, the forming of the radiator fins 14, and the forming of the flange portion 13b are performed by forging. Here, due to the restriction imposed by a forging mold, a gap of approximately 5 to 10 mm is formed between the flange portion 13b and the radiator fins 14. As a method of forming the casing 13, for example, the radiator fins 14 and the flange portion 13b may be formed by cutting. Also in this case, a gap into which a tool enters is necessary at the time of cutting a sealing surface of the flange portion 13b and hence, a gap is formed between the flange portion 13b and the radiator fins 14.

Figure 10:
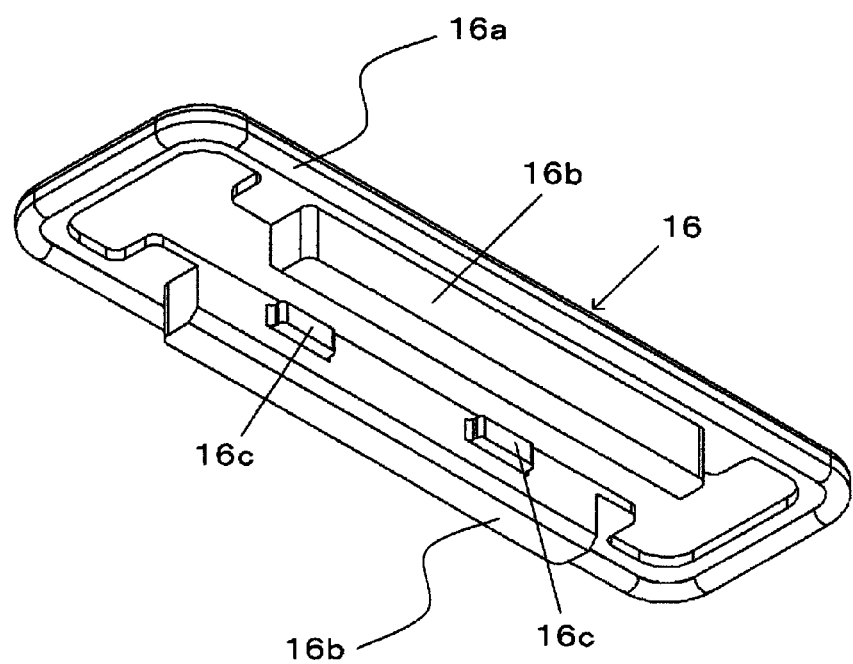
FIG. 10
A perspective view showing a shape of a seal member 16.

FIG. 10 is a perspective view showing a shape of the seal member 16. The seal member 16 includes an O-ring portion 16a having the approximately rectangular annular structure, and a pair of flow passage control portions 16b which are integrally formed inside the O-ring portion 16a. The pair of flow passage control portions 16b are formed along a long side of the O-ring portion 16a, and projections 16c are formed on surfaces of the flow passage control portions 16b which face each other in an opposed manner respectively. When the seal member 16 is mounted in the casing 13 shown in FIG. 8, the projections 16c are brought into contact with the thin wall portions 131 formed between the flange portion 13b and the thick wall portions 130.

Figure 11:
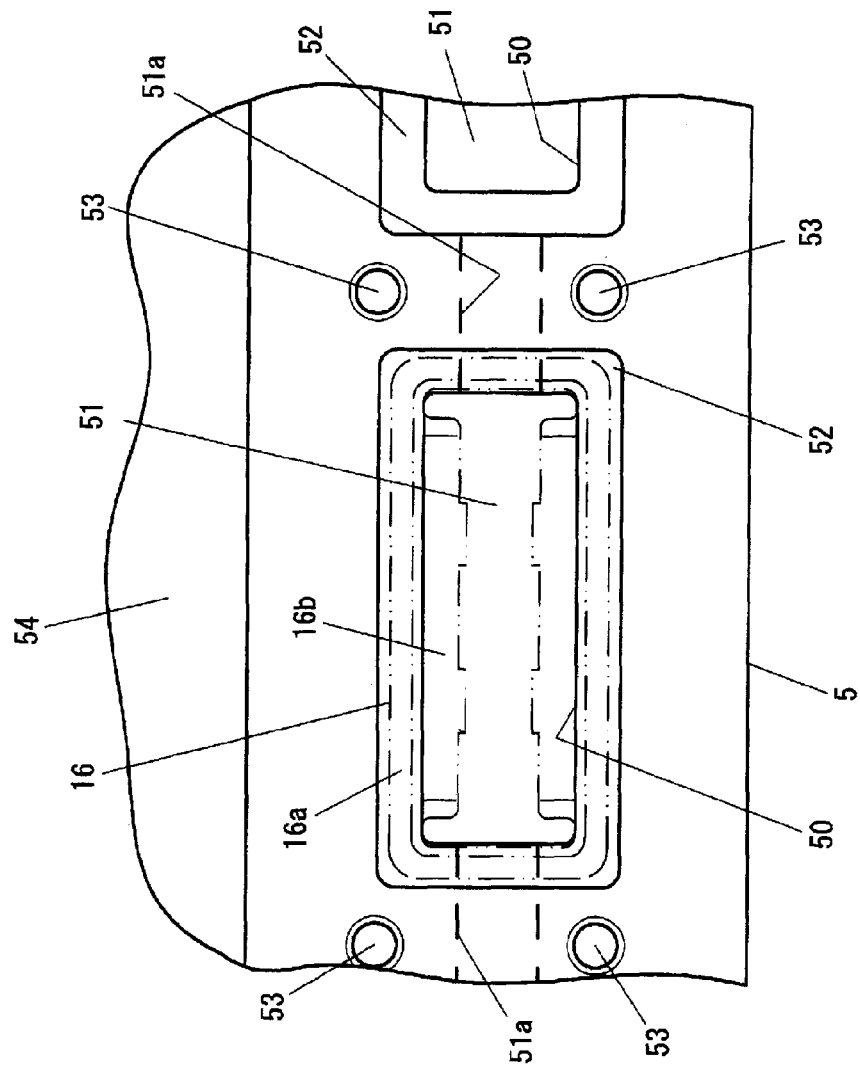
FIG. 11
A plan view showing an opening portion 50 of the cooling base 5.

FIG. 11 is a plan view showing the opening portion 50 of the cooling base 5. A seal groove 52 is formed around the approximately rectangular opening portion 50. The O-ring portion 16a of the seal member 16 is placed on an upper surface of the seal groove 52 as indicated by a double-dashed chained line. The flow passage control portions 16b which are formed on a lower surface side (on a back surface side of the paper that the drawing is on) of the seal member 16 are arranged in the inside of the flow passage 51. Numeral 53 indicates threaded holes for fixing the flange portion 13b of the power module 1 to the opening portion 50 of the cooling base 5 by bolts. A broken line 51a indicates a flow passage between the opening portions 50.

In mounting the power module 1 in the opening portion 50 shown in FIG. 11, firstly, as shown in FIG. 9, the seal member 16 is mounted on the power module 1 from a lower end of the cylindrical portion 13a as indicated by an arrow thus arranging the seal member 16 on a back surface side (sealing surface side) of the flange portion 13b. Thereafter, the cylindrical portion 13a of the power module 1 is inserted into the inside of the opening portion 50, and the flange portion 13b is placed on the cooling base 5 such that the O-ring portion 16a of the seal member 16 is arranged in the seal groove 52. Then, a pusher plate 17 having the approximately same outer peripheral shape as the flange portion 13b is arranged on the flange portion 13b, and the pusher plate 17 and the flange portion 13b are fastened together to the cooling base 5 using bolts 18. With the use of the pusher plate 17, it is possible to prevent the flange portion 13b made of aluminum from being deformed at the time of fastening the flange portion 13b by bolts so that uniform sealing can be acquired.

Figure 12:
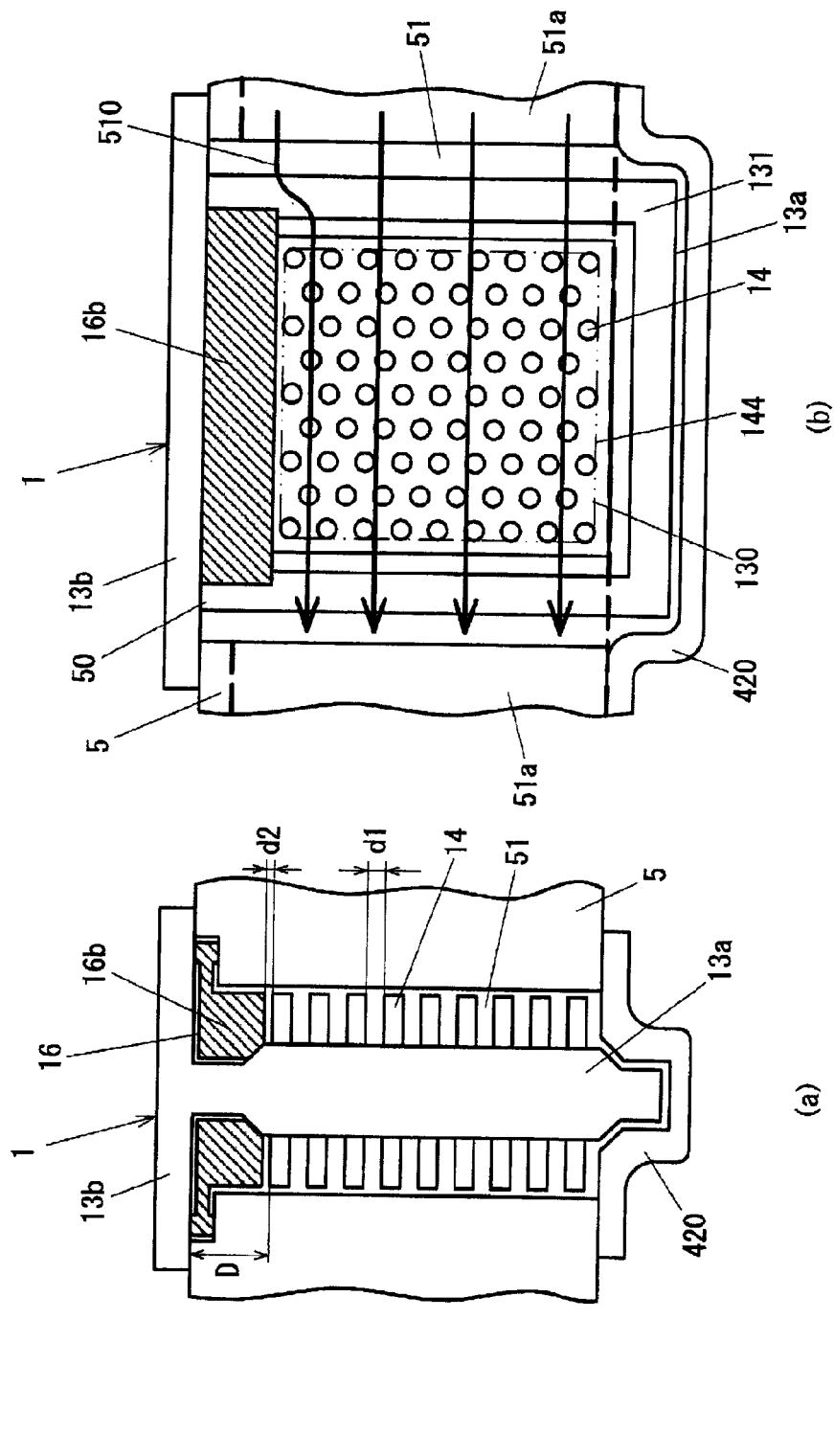
FIG. 12
Figure 13:
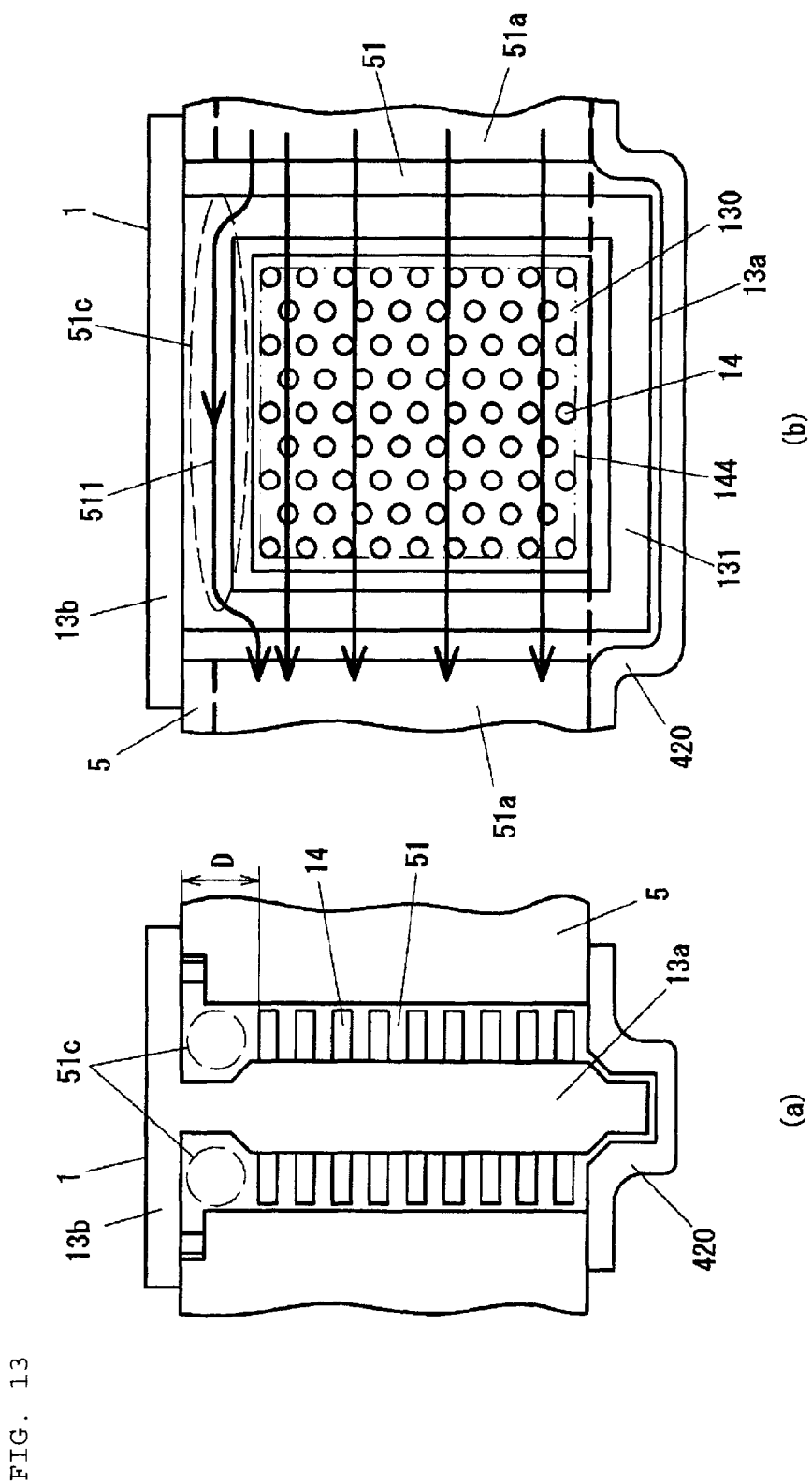

FIG. 12 and FIG. 13 are views for explaining the manner of operation of the flow passage control portion 16b. FIG. 12 shows a case where the flow passage control portions 16b are formed in the power module 1, and FIG. 13 shows a case where the flow passage control portion 16b is not formed in the power module 1. In both FIG. 12 and FIG. 13, (a) is a cross-sectional view taken along a line orthogonal to the flow of a cooling medium, and (b) is a cross-sectional view taken along a line along the flow of the cooling medium. A region surrounded by a double-dashed chained line 144 in FIG. 12 and FIG. 13 is a region where the plurality of radiator fins 14 are formed. That is, the double-dashed chained line 144 indicates a group of radiator fins. A recessed portion is formed on the lower cover 420 which constitutes a bottom surface of the flow passage 51 in a state where the recessed portion conforms to a bottom surface of the power module 1 in shape thus preventing the formation of a space on a bottom surface side through which a cooling medium bypasses.

Firstly, the flow of the cooling medium when the flow passage control portion 16b is not formed is explained in conjunction with FIG. 13. As shown in FIG. 13(a) which is the cross-sectional view, a gap of a predetermined distance D is formed between the flange portion 13b of the power module 1 and the group of radiator fins 144. This is an unavoidable gap due to the restriction imposed from a viewpoint of manufacture as described previously, and the predetermined distance D becomes approximately 5 mm to 10 mm when the casing 13 is formed by forging.

As shown in FIG. 13(b), from a right side in the drawing, as indicated by an arrow, the cooling medium flows into the flow passage 51 into which the power module 1 is inserted. While most of the flown cooling medium flows toward a left side in the drawing in such a manner that the cooling medium passes through the gaps formed between the radiator fins 14, some cooling medium flows through a region 51c where the radiator fins 14 are not formed in a bypassed manner as indicated by a stream line 511. As a result, a flow rate of the cooling medium which passes through the portion where the radiator fins 14 are formed is decreased resulting in the lowering of cooling ability of the power module 1.

On the other hand, as in the case of this embodiment shown in FIG. 12, when the flow passage control portion 16b is arranged in the gap formed between the flange portion 13b and the group of radiator fins 144, that is, the region 51c shown in FIG. 13, it is possible to prevent the cooling medium from passing through the region 51c in a bypassed manner, and also the cooling medium is guided to the group of radiator fins 144 by the flow passage control portion 16b as indicated by a stream line 510. As a result, a flow rate of the cooling medium which passes through the group of radiator fins 144 is increased so that a flow speed can be increased whereby the cooling ability of the power module 1 can be enhanced.

When a blocking member is arranged in the vicinity of an inlet of the gap region 51c for preventing a cooling medium from entering the gap region 51c, the cooling medium enters the region 51c by going, around the blocking member on a downstream side of the blocking member. Further, a vortex is generated behind the blocking member or the like so that a pressure loss is increased. Accordingly, as shown in FIG. 12(b), it is preferable that the flow passage control portion 16b is continuously arranged in the gap regions 51c having a length corresponding to a width of the group of radiator fins 144 along the flow direction of the cooling medium in the inside of the gap region 51c.

In the above-mentioned embodiment, since the flow passage control portion 16b is integrally formed with the O-ring portion 16a of the flange portion 13b, the number of man-hours of an assembling operation can be reduced, and the constitution is also useful for preventing a person from forgetting the assembling of the flow passage control portion 16b.

It is not always necessary that the flow passage control portion 16b occupies the whole space between the flange portion 13b and the group of radiator fins 144. However, to make the flow passage control portion 16b function so as to prevent a cooling medium from bypassing the group of radiator fins 144, assuming a distance between the radiator fins 14 as d1 as shown in FIG. 12(a), it is preferable to set a distance d2 between the flow passage control portion 16b and the group of radiator fins 144 smaller than the distance d1 between the radiator fins 14. For example, in a case where the radiator fin 14 is formed of a pin fin, it is preferable to set the distance between the pins to approximately 2 to 3 mm.

Figure 14:
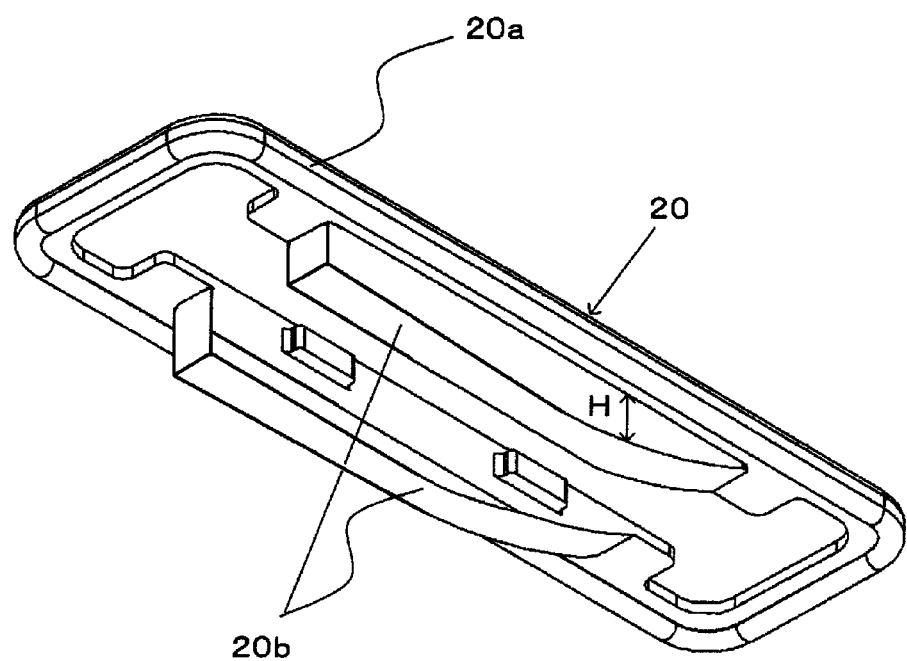

FIG. 14 is a view showing a modification of the above-mentioned seal member 16. A seal member 20 shown in FIG. 14 also is formed of an O-ring portion 20a and flow passage control portions 20b. The O-ring portion 20a has the same shape as the O-ring portion 16a shown in FIG. 10. On the other hand, the shape of the flow passage control portion 20b differs from the shape of the flow passage control portion 16b. That is, the flow passage control portion 20b has a shape where a height H of the flow passage control portion 20b is increased gradually in the leftward direction in the drawing.

Figure 15:
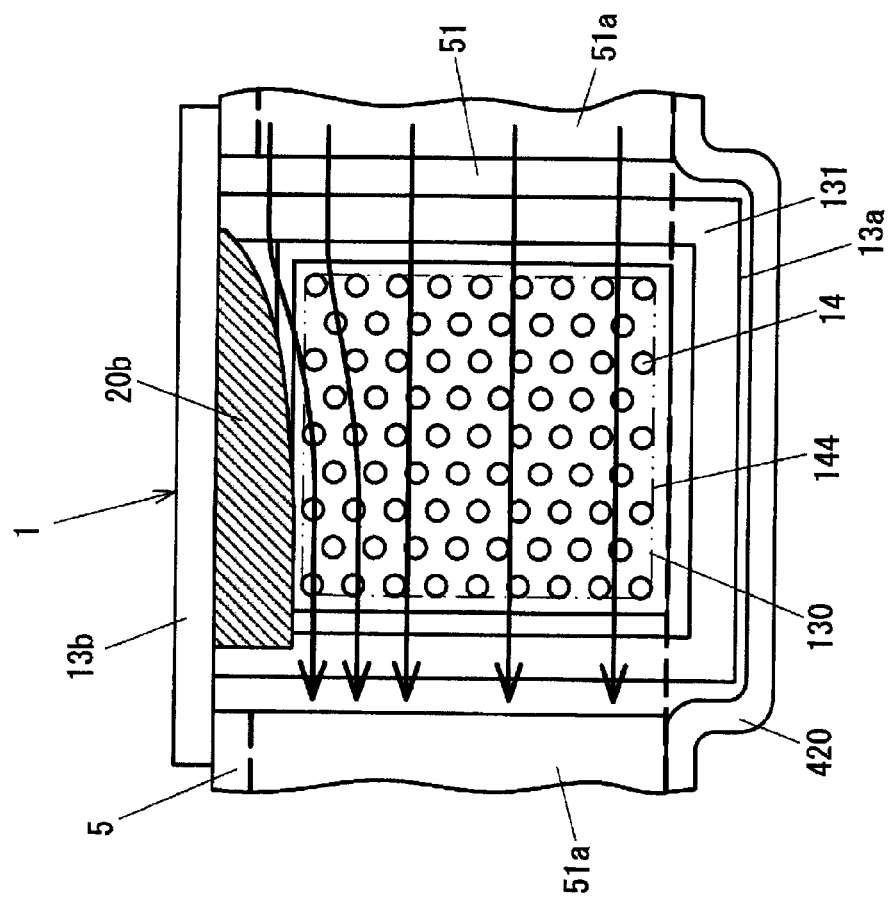

In mounting the seal member 20 on the power module 1, as shown in FIG. 15, the seal member 20 is mounted in such a manner that a side of the seal member 20 where the flow passage control portion 20b has a larger height H is positioned on a more downstream side of the cooling medium. A distance between the flow passage control portion 20b and the group of radiator fins 144 is gradually decreased along the flow of the cooling medium and hence, as indicated by a stream line, a cooling medium flows toward the group of radiator fins 144 along an inclined bottom surface of the flow passage control portion 20b. In this manner, by forming the flow passage control portion 20b into a shape where an area of a flow passage is smoothly changed along the flow direction, a straightening effect is imparted to a cooling medium so that a pressure loss can be made small.

Figure 16:
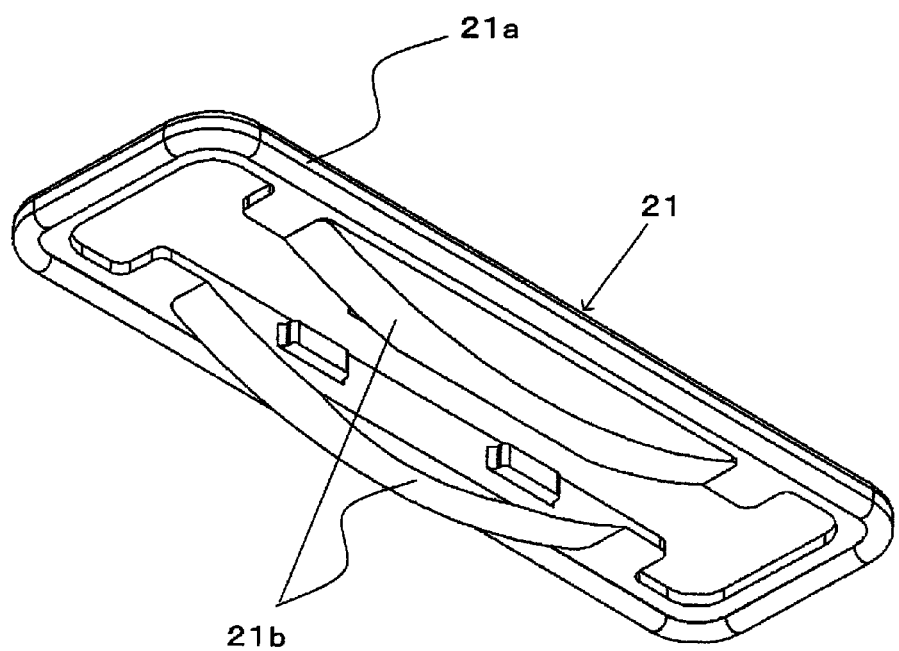

The shape of the above-mentioned flow passage control portion 20b may be deformed into a shape of a flow passage control portion 21b shown in FIG. 16. In the flow passage control portion 21b shown in FIG. 16, an inclined bottom surface is formed on both of an upstream side and a downstream side of the flow of a cooling medium. That is, the flow passage control portion 21b is formed into a shape where a distance between the flow passage control portion 21b and the group of radiator fins 144 becomes minimum at the center of the group of radiator fins 144 in the flow direction, and the distance is gradually increased in terms of being further away from the center of the group of radiator fins 144. In this manner, by forming the flow passage control portion 21b into a left-and-right symmetrical shape, even when the flow direction of the cooling medium is either the left direction or the right direction in FIG. 15, the substantially same advantageous effect can be acquired. That is, the occurrence of an error in assembling the seal member 20 can be prevented.

By adopting any one of the above-mentioned flow passage control portions described in FIG. 10, FIG. 14 and FIG. 16, a quantity of cooling medium which does not pass through the radiator fins 14 can be reduced so that a flow speed of the cooling medium which hits the radiator fins 14 can be increased and hence, the cooling ability of the power module 1 can be enhanced. The enhancement of the cooling ability contributes to the miniaturization of the cooling device and the power module. The power module 1 is allowed to generate a large quantity of heat value and hence, a size of a power-supply-use power semiconductor can be decreased thus contributing to the reduction of cost.

When the further reduction of a pressure loss is required, it is desirable to adopt the flow passage control portions 20b, 21b having a shape shown in FIG. 14 and FIG. 16. On the other hand, when the emphasis is placed on the enhancement of the cooling performance, it is preferable to adopt the flow passage control portions 16b shown in FIG. 10 which has the structure where a cooling medium does not go around between the flange portion 13b and the group of radiator fins 144. In this manner, the present invention can cope with a plurality of vehicles having different specifications on requirements using the same power module 1 and hence, the power conversion device of the same type can cope with a plurality of vehicles whereby a development cost and a manufacturing cost can be lowered.

Figure 17:
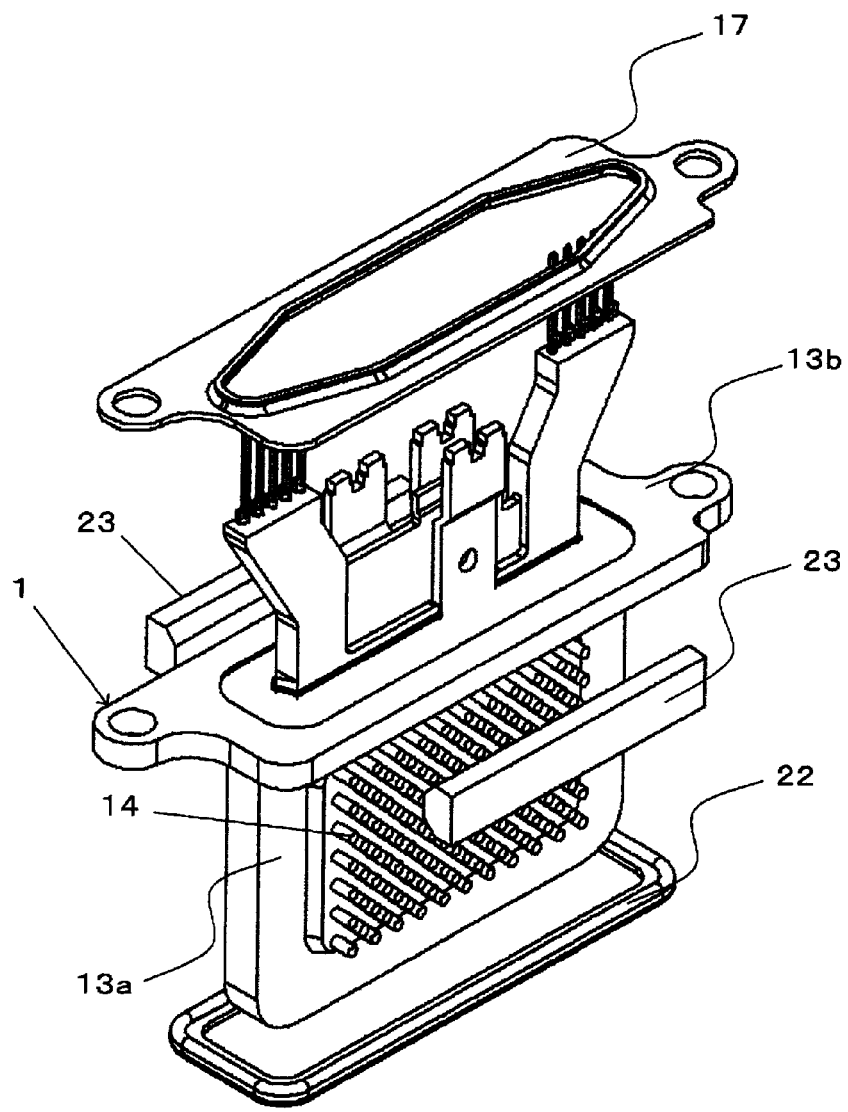

In the above-mentioned embodiment, the O-ring portion of the flange portion 13b which has a sealing function, and the flow passage control portion which blocks the flow of a cooling medium are integrally formed. However, as shown in FIG. 17, the O-ring portion may be formed as a body separate from the flow passage control portion. In the example shown in FIG. 17, a standard seal material is used as a seal member 22 of the flange portion 13b. Two independent flow passage control members 23 are arranged between the flange portion 13b and the radiator fins 14. The flow passage control member 23 shown in FIG. 17 has the substantially same shape as the flow passage control portion 16b shown in FIG. 10. However, the flow passage control member 23 shown in FIG. 17 may have a shape of the flow passage control portion 20b shown in FIG. 14 or a shape of the flow passage control portion 21b shown in FIG. 16. By adopting such a constitution, a seal member having a standard shape is used as the seal member 22 and hence, it is unnecessary to particularly prepare a dedicated mold so that a manufacturing cost of the seal member can be suppressed.

(Fixing Structure of Power Module 1)

In the above-mentioned embodiment, the pusher plate 17 is used for fixing the power module 1. This is because the casing 13 is formed using an extremely soft pure-aluminum-based material by forging and hence, when the flange portion 13b is fixed by bolts without using the pusher plate 17, the flange portion 13b is deformed due to a repulsive force of the seal member 16. Accordingly, the pusher plate 17 is formed using a material such as steel. However, to lower a stress generated in the pusher plate 17, the bolt holes 13c through which the bolt passes are formed also in the flange portion 13b of the casing 13 thus adopting the configuration where the pusher plate 17 and the flange portion 13b are fastened together. Further, as shown in FIG. 9 and FIG. 17, positions of the bolt holes 13c formed in the flange portion 13b are displaced from each other. As a result, when a plurality of power modules 1 are arranged on one straight line as shown in FIG. 5, the bolts are arranged in a staggered manner so that the total length of the power conversion device in a state where the power modules 1 are mounted can be shortened.

The arrangement of the power modules 1 can be changed depending on restriction conditions imposed on a shape of the whole power conversion device and hence, when a pusher plate is used, it is desirable to cope with the change in the arrangement of the power modules 1 by only changing of the pusher plate without forming bolt holes for fixing by bolts in the power modules 1 even when the arrangement of the power modules 1 is changed.

Figure 18:
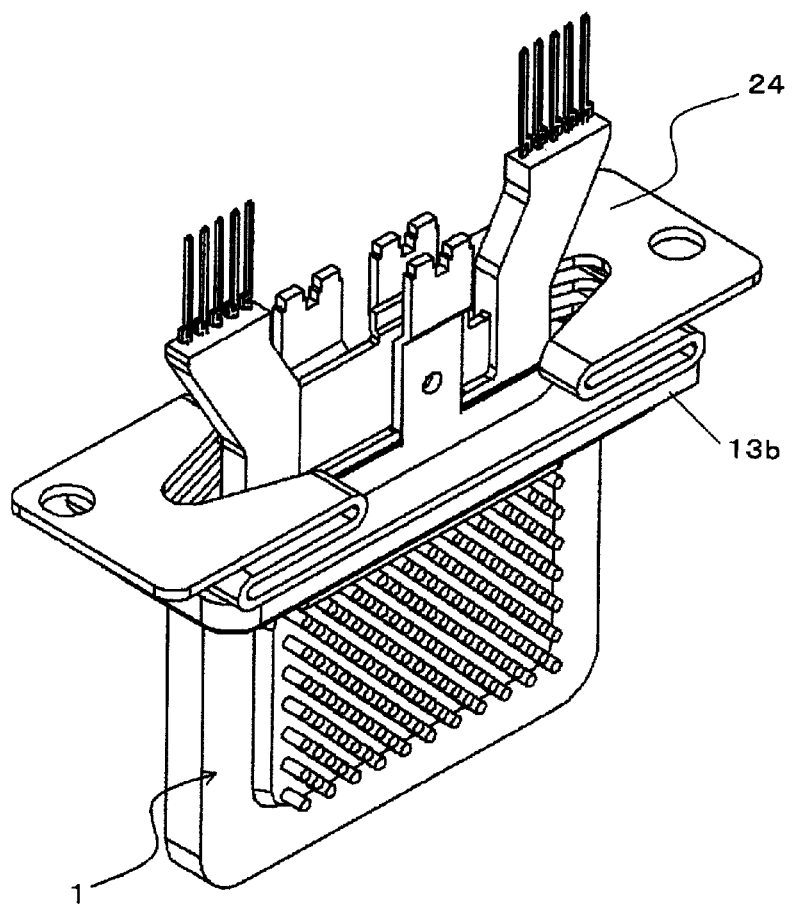

FIG. 18 shows one example of the constitution where bolt holes are not formed in the flange portion 13b. The bolt holes for fixing by bolts are not formed in the flange portion 13b of the power module 1 and hence, a pusher plate 24 is directly fixed to the cooling base 5 by bolts in place of being fastened together with the flange portion 13b. Accordingly, to absorb the manufacture tolerances of thicknesses of the flange portion 13b and a seal member, a shape of the pusher plate 24 in the vicinity of the bolt hole is formed into a zigzag spring shape. Due to such a constitution, the formation of bolt holes in the flange portion 13b of the power module 1 becomes unnecessary and hence, various arrangements of the power modules 1 can be realized using the power modules 1 having the same shape, and the power conversion device can easily cope with a change in the arrangement of the power modules when the arrangement of the power modules 1 is changed.

Figure 19:
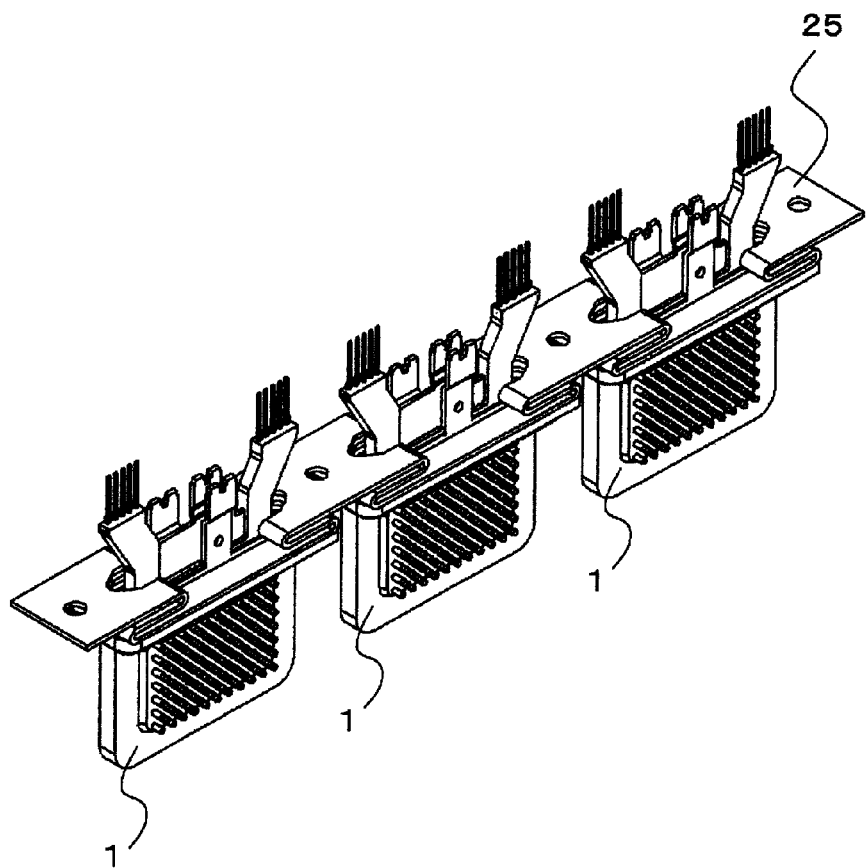

In the example shown in FIG. 18, one pusher plate 24 is necessary for every power module. However, in a case of a pusher plate 25 shown in FIG. 19, three power modules 1 are fixed using one pusher plate 25 and hence, the number of bolts can be decreased whereby the number of man-hours in assembling can be decreased.

In the above-mentioned embodiment, the radiator fins 14 are formed of a pin fin. However, the radiator fins 14 may have other shapes and, for example, the radiator fins may be formed of a straight fin. Although the above-mentioned casing 13 is integrally formed by forging, even in a case of a cylindrical casing which is formed by other manufacturing methods, the formation of a gap between the flange portion 13b for fixing the power module 1 to the cooling base 5 and the group of radiator fins 144 is unavoidable in terms of manufacture. Accordingly, by arranging a flow passage control portion in such a gap, the substantially same advantageous effects as the above-mentioned embodiment can be obtained. Particularly, in the case of the casing shown in FIG. 8, the thin wall portion 131 for plastic deformation is formed between the flange portion 13b and the group of radiator fins 144 and hence, it is impossible to prevent the further increase of the gap between the flange portion 13b and the group of the radiator fins 144 whereby advantageous effects brought about by the provision of the flow passage control portion is further increased. In the above-mentioned embodiment, the explanation has been made by taking the vehicle-mounted power conversion device mounted on an electric vehicle or a hybrid vehicle as an example. However, provided that the power conversion device is a power conversion device having the cooling structure where a power module is immersed in a cooling medium, the present invention is also applicable to such a power conversion device.

The above-mentioned respective embodiments can be used in a single form respectively or in combination. This is because advantageous effects which can be acquired by the respective embodiments may be acquired independently or synergistically. Further, unless the technical features of the present invention are impaired, the present invention is not limited by the above-mentioned embodiments at all.

The contents disclosed in the following application based on which priority is claimed are incorporated in this specification in the form of cited literature. Japanese patent application 2010-168813 (filed on Jul. 28, 2010).

The invention claimed is:

1. A power conversion device comprising:
    a flow passage casing in which a flow passage through which a cooling medium flows is formed and an opening portion which is communicated with the flow passage is formed;
    a power module having a bottomed cylindrical portion in which a power semiconductor element is housed and which is inserted into the flow passage through the opening portion, a first group of radiator fins which are mounted on an outer peripheral surface of the cylindrical portion, and a second group of radiator fins which are mounted on the outer peripheral surface of the cylindrical portion;
    a first flow passage control member which introduces the cooling medium into the first group of radiator fins;
    a second flow passage control member which is arranged opposite to the first flow passage control member with the bottomed cylindrical portion sandwiched therebetween, and introduces the cooling medium into the second group of radiator fins; and
    a seal member having a ring portion which connects the first flow passage control member and the second flow passage control member, wherein
    power is converted into AC power from DC power or into DC power from AC power by a switching operation of the power semiconductor element, and
    the seal member is mounted on the bottomed cylindrical portion.

2. The power conversion device according to claim 1, wherein
the bottomed cylindrical portion comprises a flange portion which is fixed to the flow passage casing so as to close the opening portion,
the ring portion is arranged between the flow passage casing and the flange portion,
the first flow passage control member is arranged in a first gap formed between the flange portion and the first group of radiator fins, and
the second flow passage control member is arranged in a second gap formed between the flange portion and the second group of radiator fins.

3. The power conversion device according to claim 2, wherein
the first flow passage control member is arranged such that a minimum distance between the first flow passage control member and the first group of radiator fins is set equal to or less than a distance between the fins of the first group of radiator fins, and
the second flow passage control member is arranged such that a minimum distance between the second flow passage control member and the second group of radiator fins is set equal to or less than a distance between the fins of the second group of radiator fins.

4. The power conversion device according to claim 2, wherein the first flow passage control member is continuously distributed in the first gap along a flow direction of the cooling medium, and the second flow passage control member is continuously distributed in the second gap along the flow direction of the cooling medium.

5. The power conversion device according to claim 4, wherein
the first flow passage control member has a shape by which a distance between the first flow passage control member and the first group of radiator fins is decreased along the flow direction of the cooling medium, and
the second flow passage control member has a shape by which a distance between the second flow passage control member and the second group of radiator fins is decreased along the flow direction of the cooling medium.

6. The power conversion device according to claim 4, wherein
the first flow passage control member has a shape by which the distance between the first flow passage control member and the first group of radiator fins becomes minimum at a center in the flow direction of the first group of radiator fins, and the distance is gradually increased as being farther away from the center in the flow direction,
the second flow passage control member has a shape by which the distance between the second flow passage control member and the second group of radiator fins becomes minimum at a center in the flow direction of the second group of radiator fins, and the distance is gradually increased as being farther away from the center in the flow direction.

* * * * *